(12) United States Patent
Kress

(10) Patent No.: US 10,224,801 B2
(45) Date of Patent: Mar. 5, 2019

(54) ASYMMETRICAL BIPOLAR VOLTAGE SUPPLY

(71) Applicant: IIE GMBH & CO. KG, Soyen (DE)

(72) Inventor: Ekkehard Kress, Wasserburg (DE)

(73) Assignee: IIE GmbH & Co. KG, Soyen (DE)

( * ) Notice: Subject to any disclaimer, the term of this patent is extended or adjusted under 35 U.S.C. 154(b) by 0 days.

(21) Appl. No.: 15/743,428

(22) PCT Filed: Aug. 2, 2016

(86) PCT No.: PCT/EP2016/068420
§ 371 (c)(1),
(2) Date: Jan. 10, 2018

(87) PCT Pub. No.: WO2017/021404
PCT Pub. Date: Feb. 9, 2017

(65) Prior Publication Data
US 2018/0212506 A1  Jul. 26, 2018

(30) Foreign Application Priority Data

Aug. 3, 2015 (DE) ............ 10 2015 009 797

(51) Int. Cl.
*H02M 1/08* (2006.01)
*H02M 3/335* (2006.01)
*H02M 7/5387* (2007.01)
*H03K 17/22* (2006.01)
*H03K 17/687* (2006.01)

(52) U.S. Cl.
CPC ......... *H02M 1/08* (2013.01); *H02M 3/33569* (2013.01); *H02M 7/5387* (2013.01); *H03K 17/223* (2013.01); *H03K 17/687* (2013.01)

(58) Field of Classification Search
None
See application file for complete search history.

(56) References Cited

U.S. PATENT DOCUMENTS

| 5,245,520 | A | 9/1993 | Imbertson |
| 2006/0152082 | A1 | 7/2006 | Gruber |
| 2015/0131329 | A1* | 5/2015 | Chen ................ H02M 1/08 363/17 |
| 2015/0137871 | A1 | 5/2015 | Takano |
| 2017/0093299 | A1* | 3/2017 | Norimatsu ............ H02M 5/458 |
| 2017/0373496 | A1* | 12/2017 | Hu ............................ H02J 1/00 |

OTHER PUBLICATIONS

International Search Report From Corresponding PCT Application No. PCT/EP2016/068420, dated Aug. 2, 2016.

* cited by examiner

*Primary Examiner* — Cassandra F Cox
(74) *Attorney, Agent, or Firm* — Robert W. Morris; Eckert Seamans Cherin & Mellott, LLC

(57) ABSTRACT

An asymmetrical bipolar voltage supply comprising a transformer (1), having at least one primary winding (7) and a plurality of secondary windings (8) and a primary-side power supply (2; 25; 28) connected to at least one DC voltage source. The circuit is configured and connected so as to generate in the transformer two oppositely polarized winding voltages UW1 and UW2 with different amplitudes.

13 Claims, 3 Drawing Sheets

US 10,224,801 B2

ASYMMETRICAL BIPOLAR VOLTAGE SUPPLY

BACKGROUND OF THE INVENTION

The invention concerns an asymmetrical bipolar voltage supply having a transformer with at least one primary winding and a plurality of secondary windings, and a primary-side power supply connected to the transformer.

Modern power semiconductors that are to be used as semiconductor switches require an asymmetrical bipolar voltage supply of, for example, +15 and −5 volts for gate control. This is to prevent faulty switching. Such faulty switching can occur if the gate control is only set to zero potential in order to reach a switching state, and an interference is superimposed on this zero potential. In such a case, the semiconductor switch may begin to oscillate, which would quickly lead to its destruction. If, however, a voltage of −5 volts is applied, an interference cannot hinder the proper operation.

To control the semiconductor switches of a full-bridge (also referred to as an H-bridge), four gate drivers are required with the technology customary today, wherein each gate driver is connected to one asymmetrical bipolar voltage source. In a modern three-phase power supply with Power Factor Correction (PFC) and downstream full-bridge voltage converter, six semiconductor switches are required for the PFC and four semiconductor switches for the downstream full-bridge voltage converter. Thus, ten gate drivers with the associated asymmetrical bipolar voltage sources are required. A regenerative variable frequency drive requires even at least twelve gate drivers with the above-mentioned asymmetrical bipolar voltage sources.

Usually, a transformer that has a corresponding number of secondary windings is used for the design of such a voltage source. A separate winding is required for the positive and the negative voltage, respectively, wherein the positive and the negative windings can have a common ground point. The output voltages are set via the turn ratio of primary and secondary windings.

This means that two secondary windings have to be provided for each gate driver. Thus, in the above-mentioned full-bridge circuit, eight secondary windings are required and even twenty secondary windings are required in the above-mentioned three-phase power supply.

This large number of secondary windings leads to an overall design size with the associated high parasitic capacitances. These parasitic capacitances can lead to disturbances, which are caused by leakage currents and, in the worst case, will lead to a destruction of the voltage supply or the gate driver.

SUMMARY OF THE INVENTION

The problem addressed by the invention is that of developing an asymmetrical bipolar voltage source such that the aforementioned disadvantages can be avoided or at least can be minimized.

According to the invention, this problem is solved by connecting the primary-side power supply to at least one DC voltage source in such a way as to generate the transformer two oppositely polarized winding voltages UW1 and UW2 with different amplitudes. As used herein, the term "winding voltage" is intended to refer to the voltage induced per winding turn.

With this circuit configuration, the number of secondary windings in the transformer can be reduced by half. Because only oppositely polarized winding voltages of equal amplitudes are generated in voltage supplies of the prior art, the required different voltages must be generated on the secondary side of the transformer. This is always associated with an increase in the number of secondary windings. In the voltage supply according to the invention, however, an asymmetrical bipolar alternating voltage is already generated on the primary side, which is induced in each of the secondary windings. Consequently, an alternating voltage with different amplitudes in the positive and in the negative range can be tapped at the secondary windings.

In one embodiment of the invention, the primary-side voltage supply has a push-pull circuit with two primary semiconductor switches, wherein the at least one primary winding has two primary winding parts and is additionally connected to the push-pull circuit via a tap between the primary winding parts. Although only two semiconductor switches are needed in this embodiment, a primary winding with two primary winding parts is required. The simple solution due to the small number of semiconductor switches is here compared to the high complexity of several primary windings (which also require multiple layers in a planar transformer). This embodiment can be realized in several variants.

In a first variant, the primary semiconductor switches of the push-pull circuit of the primary-side voltage supply are connected to two DC voltage sources with different voltages U1 and U2, wherein the two primary winding parts on both sides of the tap have the same number of turns. It is consequently a center tap of the primary winding. Here either the voltage U1 is applied to the one primary winding part of the primary winding, or the different voltage U2 inverted (based on the winding polarity) to the other primary winding part of the primary winding. The bipolar alternating voltage with different amplitude at the primary winding is thus achieved here by the alternating application of two different DC voltage sources.

In a second variant, the primary semiconductor switches of the push-pull circuit of the primary-side voltage supply are connected to the same DC voltage source, wherein the two primary winding parts have different numbers of turns on both sides of the tap. Here, either a voltage is applied at the one primary winding part of the primary winding or the same voltage is applied inverted (relative to the winding polarity) at the other primary winding part of the primary winding. In this variant, the bipolar alternating voltage with a different amplitude comes about through alternating application of the same DC voltage source to different primary winding parts and by the different turn ratio of the primary winding parts to the secondary windings.

However, to generate an asymmetrical, bipolar alternating voltage at the primary-side winding, the primary-side voltage supply particularly advantageously has a full-bridge circuit with four primary semiconductor switches, wherein each leg of the full-bridge circuit is connected to another DC voltage source.

To do without a regulation of the secondary-side voltage, the at least one DC voltage source connected to the primary-side voltage supply is regulated. Such regulated DC voltage sources are common, and therefore available inexpensively on the market.

When generating the AC voltage on the primary side of the transformer, one must ensure that the magnetic saturation is never reached. For this purpose, the profile of the AC voltage must meet certain conditions. The primary semiconductor switches are therefore switched so that, at the at least one primary winding, during the period t1, the winding voltage UW1 is applied and during a period t2 the inverted winding voltage UW2 is applied, whereby the integral below the winding voltage UW1 over the period t1 corresponds to the integral below the winding voltage UW2 over the period t2. Since the amplitudes have different signs in the generated AC voltage, the integral means the respective absolute value.

Likewise, several secondary semiconductor switches are also provided advantageously on the secondary side. Exactly one secondary winding is associated with each of these secondary semiconductor switches. Since an asymmetrical bipolar alternating voltage is already generated on the primary side, two windings are not required on the secondary side for each secondary semiconductor switch. Consequently, the number of secondary windings can be halved compared the voltage supplies the prior art.

Each secondary winding supplies one voltage with a positive sign and a second voltage with a different amplitude and a negative sign. Both voltages must be provided to a driver, so that the respective switching voltage can be applied to the gate of the secondary semiconductor switches.

Therefore, each secondary semiconductor switch is controlled by a driver assigned to it.

To provide the drivers with the two necessary switching voltages, the two voltage inputs of each driver are connected to the output of a rectifier circuit with diodes and capacitors that is associated with the driver. In this way, a positive voltage with a certain amplitude is always applied to the one voltage input of the driver, while a negative voltage with a different amplitude is always applied to the other voltage input of the driver.

It is particularly advantageous when each secondary winding supplies a rectifier circuit with voltage. This means that a separate voltage supply for controlling the gate is provided for each secondary semiconductor switch. This voltage supply is fed via a secondary winding and further includes a rectifier circuit and a driver. The voltage supplies are identical for all secondary semiconductor switches.

To generate an AC voltage tailored to a specific load, each driver is controlled by one controller. Consequently, it is determined via the controller if the positive voltage applied to the driver with a certain amplitude, or the negative voltage of a different amplitude applied to the driver is switched through to the gate of the secondary semiconductor switch.

The secondary semiconductor switches advantageously form a secondary-side full-bridge circuit, which is supplied with DC voltage via a further DC voltage source. Here, diagonal secondary semiconductor switches are synchronized, so that a rectangular alternating voltage can be applied to a connected load. Four secondary windings and four secondary semiconductor switches are necessary for this application.

For a three-phase power supply with PFC, two secondary semiconductor switches and two secondary windings are required per phase for the PFCs alone. For these six secondary windings and six secondary semiconductor switches then come four more secondary windings and secondary semiconductor switches for the downstream full-bridge. Thus, a total often secondary windings and ten secondary semiconductor switches are needed for this application.

The transformer may be designed as a conventional winding transformer. In particular in applications where a large number of secondary windings is required, however, the use of a planar transformer offers enormous advantages. With this planar transformer, one layer each of a multilayer pc-board is provided for each winding (at least one primary winding and secondary windings). The transformer is therefore particularly advantageously designed as a planar transformer, wherein an upper and a lower layer each with a primary winding are provided and the layers with the secondary windings are arranged between them.

For a full understanding of the present invention, reference should now be made to the following detailed description of the preferred embodiments of the invention as illustrated in the accompanying drawings.

DESCRIPTION OF THE PREFERRED EMBODIMENTS

Figure 1:
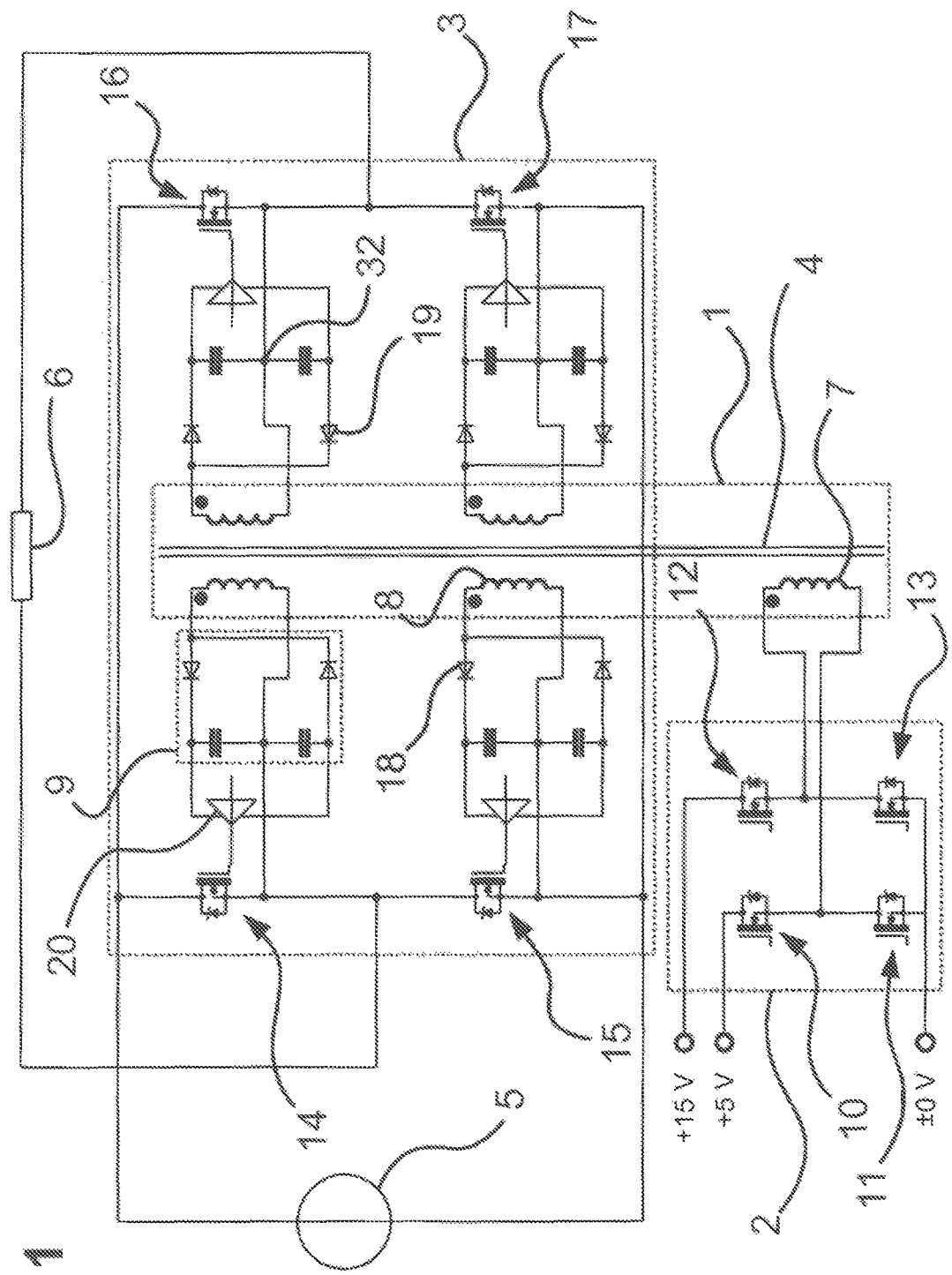
FIG. 1 is a schematic wiring diagram of an exemplary embodiment of an asymmetrical bipolar voltage supply according to the invention.

The preferred embodiments of the present invention will now be described with reference to FIGS. 1-5 of the drawings. Identical elements in the figures are designated with the same reference numerals.

A bipolar power supply that supplies both a voltage of +15 V and a voltage of −5 V is often required for the gate control of modern fast semiconductor switches, such as SiC or GaN FETs. The invention will therefore be explained with reference to an embodiment of a respective asymmetrical bipolar voltage supply. FIG. 1 shows a schematic circuit diagram of such a voltage supply, in which the illustration of details that are not essential to the invention has been omitted.

The circuit has a transformer 1, which has a primary winding 7 and four secondary windings 8. A full-bridge circuit 2 that is formed by the four primary semiconductor switches 10 to 13 is provided on the primary-side of the transformer 1. The two legs of the full-bridge circuit 2 are supplied with different regulated DC voltages. Thus, the leg shown on the left of the primary-side full-bridge circuit 2 is connected to a regulated DC voltage source that supplies a DC voltage of +5 V, while the regulated DC voltage source for the leg of the primary-side full-bridge circuit 2 shown on the right supplies a DC voltage of +15 V. The control of the primary semiconductor switches 10 to 13 is not shown, as it is not essential to the invention.

A full-bridge circuit 3, which is formed by the four secondary semiconductor switches 14 to 17, is also provided on the secondary side. The secondary semiconductor switches 14 to 17 are each controlled by a driver 20, which is supplied via the secondary winding 8 and a rectifier circuit 9 with an asymmetrical bipolar DC voltage of +15 V and −5 V. The control of the drivers 20 is not shown, since it is not essential for the understanding of the invention.

The secondary-side full-bridge circuit 3 is supplied by the DC voltage source 5 with a DC voltage. The DC voltage of the DC voltage source 5 can be converted into an AC voltage for the voltage supply of the load 6 via the secondary-side full-bridge circuit 3.

Figure 2:
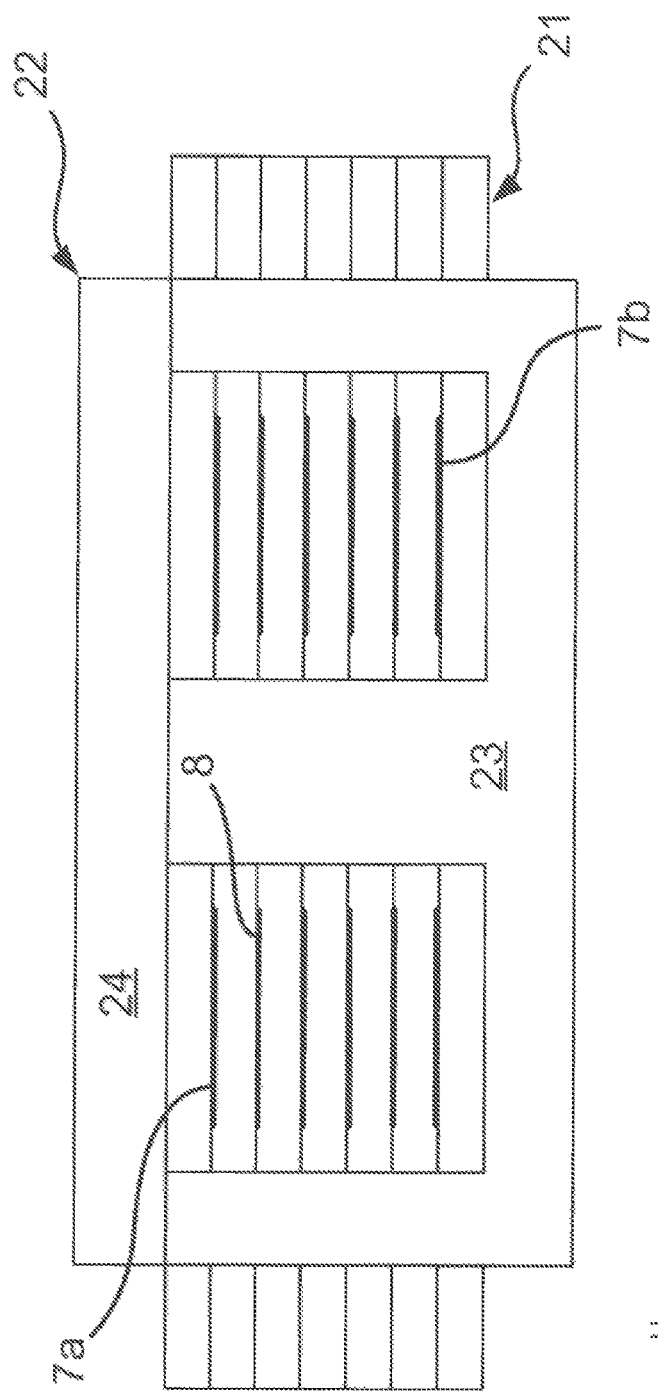
FIG. 2 is a schematic view of a planar transformer for voltage supply according to the invention.

FIG. 2 schematically shows a planar transformer having an EI core 22 and a multi-layer pc-board 21. The E-part 23 of the core 22 is inserted through recesses of the multi-layer pc-board 21. The I-part 24 was then connected to the legs of the E-part 23.

A winding is realized on each layer and ideally consists of a single winding. Unlike in the exemplary embodiment according to FIG. 1, two primary windings 7a and 7b are provided in the exemplary embodiment shown here. The four secondary windings 8 are arranged between the two primary windings 7a and 7b. In this way, a very homogeneous magnetic field can be generated by the primary windings 7a and 7b, in which the secondary windings 8 are arranged. In the example shown here, the multilayer pc-board 21 contains six layers and is provided at the top and bottom with a cover against the core 22.

The two primary windings 7a and 7b can be connected in parallel and supplied with a voltage using the same primary-side full-bridge circuit. However, it is also possible to interconnect the two primary windings 7a and 7b in series. In this case, however, DC voltage sources must be provided on the primary side, which supplies higher voltages, i.e., 10 V here for the left leg and 30 V for the right leg.

The planar transformer shown is equipped with four secondary windings 8 for the circuit of the secondary side full-bridge circuit. There are no longer eight secondary windings required as in a circuit according to the prior art. In a modern three-phase power supply with PFC and downstream full-bridge voltage converter, however, ten secondary windings need to be provided (not shown here) also for controlling the ten necessary semiconductor switches (instead of 20 secondary windings according to the prior art). A planar transformer for such an application would thus have twelve layers.

By halving the number of secondary windings over the prior art, the size of the voltage supply can be reduced enormously. But since the reduction of the size is also accompanied by a reduction of the parasitic capacitances, a strong reduction of interferences and thus of faulty switches can be ensured. Furthermore, the production costs are reduced as well with the reduction in design size and the number of necessary layers.

The primary-side full-bridge circuit can be operated at a frequency of several hundred kilohertz, that is, for example, at 600 kHz. The primary semiconductor switches 10 to 13 are always switched diagonally in pairs. For example, the primary semiconductor switches 10 and 13 open while the primary semiconductor switches 11 and 12 simultaneously close. In this first state of the primary-side full-bridge circuit 2 a voltage of +5 V against the upper end of the primary winding 7 is present at the lower end of the primary winding 7. If the primary winding 7 consists of a single turn, the turn voltage UW1 is −5 V in this switching state.

After switching the primary-side full-bridge circuit 2 to a second state, the primary semiconductor switches 11 and 12 are switched open, while the primary semiconductor switches 10 and 13 are switched closed. In this second state, a voltage of +15 V against the lower end of the primary winding 7 is applied at the upper end of the primary winding 7. In the case of a primary winding 7 with only one turn, the turn voltage UW2 is +15 V in this switching state.

In the following, it is assumed that the ratio of the secondary windings 8 to the primary winding 7 (FIG. 1) is 1:1:1:1:1. In the two possible switching states of the primary-side full-bridge circuit 2, the current flows in the respective opposite direction. This causes a voltage to be generated with the secondary windings 8, which changes between +15 V and −5 V with the change of the switching states of the primary-side full-bridge circuit 2. Consequently, an alternating voltage is generated that has an asymmetrical amplitude and changes between +15 V and −5 V.

Figure 3:
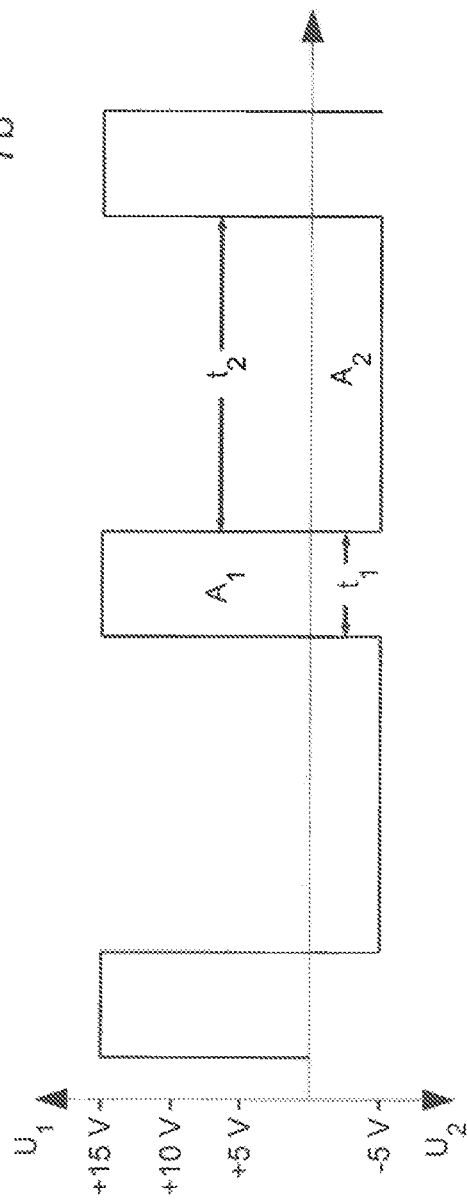
FIG. 3 shows the output voltage of the primary-side full-bridge circuit.

The voltage profile at the primary winding 7 and consequently also at the secondary windings 8 is shown in FIG. 3. This is a square wave voltage with a first amplitude of +15 V and a second amplitude of −5 V. In order to prevent the planar transformer 1 from reaching magnetic saturation, the condition $$U1 \times t1 = U2 \times t2 \qquad (1)$$

must be met. Accordingly, the areas A1 and A2 corresponding to the respective integral of the voltage with the positive amplitude and the negative amplitude, respectively, must have an identical size. In the example shown here, the amplitude of the positive voltage U1 is three times the amplitude of the negative voltage U2. Consequently, the period t2 for the voltage with the negative amplitude must also be three times the period t1 for the voltage with the positive amplitude.

Thus:

U1=3 U2 and as a consequence, placed into (1)

3 U2×t1=U2×t2, thus t2=3t1

This asymmetrical AC voltage is applied to each of the four rectifier circuits 9. The rectifier diode 18 has continuity for currents flowing when the positive voltage (here +15 V) against the lower end of the secondary winding is present at the upper end of the secondary winding, and is closed for currents that flow when the negative voltage (here of −5 V) against the lower end of the secondary winding is present at the upper end of the secondary winding. The rectifier diode 19 behaves exactly opposite. It is closed to currents that flow when the positive voltage (here +15 V) against the lower end of the secondary winding is present at the upper end of the secondary winding and has continuity for currents that flow when the negative voltage (here of −5 V) against the lower end of the secondary winding is present at the upper end of the secondary winding.

In the period t1, a voltage of +15 V against the voltage reference point 32 is therefore present at the upper input of the driver 20, i.e., the input for the positive voltage supply. At the same time the upper capacitor is charged. During the period t2, on the other hand, a voltage of −5 V against the voltage reference point 32 is present at the lower input of the driver 20, i.e., the input for the negative voltage supply, while the lower capacitor is charged at the same time. Consequently, with appropriate tuning of the two capacitors, one capacitor is always charged via the respective diode, while at the same time the induced voltage is present at the respective input of driver 20. During this period, the voltage from the respective capacitor that is currently not being charged is present at the respective other input of the driver 20.

Consequently, each of the drivers 20 is constantly supplied with an asymmetrical bipolar DC voltage of +15 V and −5 V. The voltage of +15 V is always present at the upper input and the voltage of −5 V always at the lower input.

Load 6 is to be operated with an alternating voltage that is to be generated via the secondary-side full-bridge circuit 3. The secondary-side full-bridge circuit 3 is supplied by a DC voltage source 5. Also, the secondary semiconductor switches 14 to 17 are switched diagonally in pairs, so that the semiconductor switches 14 and 17, or 15 and 16, respectively are always in the same switching state. The semiconductor switches 14 to 17 are controlled via the respective driver 20, wherein either a voltage of +15 V or a voltage of −5 V is applied to the gates of the semiconductor switches. The drivers in turn are controlled by a control not shown here in the required manner and the required frequency. Of course, circuits may also be provided to give the output signal of the secondary-side full-bridge circuit 3 any desired shape or to perform a pulse width modulation, which are also not shown here for reasons of clarity.

With the voltage supply according to the invention, very small design sizes can be achieved due to the greatly reduced number of secondary windings 8. Parasitic capacities can be kept very low in this way. The production costs are lowered.

The task can be solved optimally with planar transformers that are realized in multilayer PCB technology. With this technology, a separate layer must be used for each winding.

In the realization of a three-phase power supply with PFC (not shown in the drawing) a printed circuit board with 22 layers would need to be provided according to conventional technology when using two primary windings. With the aid of the invention, this voltage supply can be realized with a printed circuit board with only 12 layers. This results in an immense space and cost advantage.

Only one secondary winding is now needed for the different positive and negative voltages. The transformer is controlled such that the two half-waves of a period have different amplitudes. Thus, it is possible to generate +15 V as well as −5 V with a secondary winding by means of separation through two diodes.

A push-pull circuit with only two semiconductor switches and a primary winding with a tap can be used instead of a primary-side full-bridge circuit. Such alternative circuits are presented in FIGS. 4 and 5. The same components as in FIG. 1 are given the same reference sign.

Figure 4:
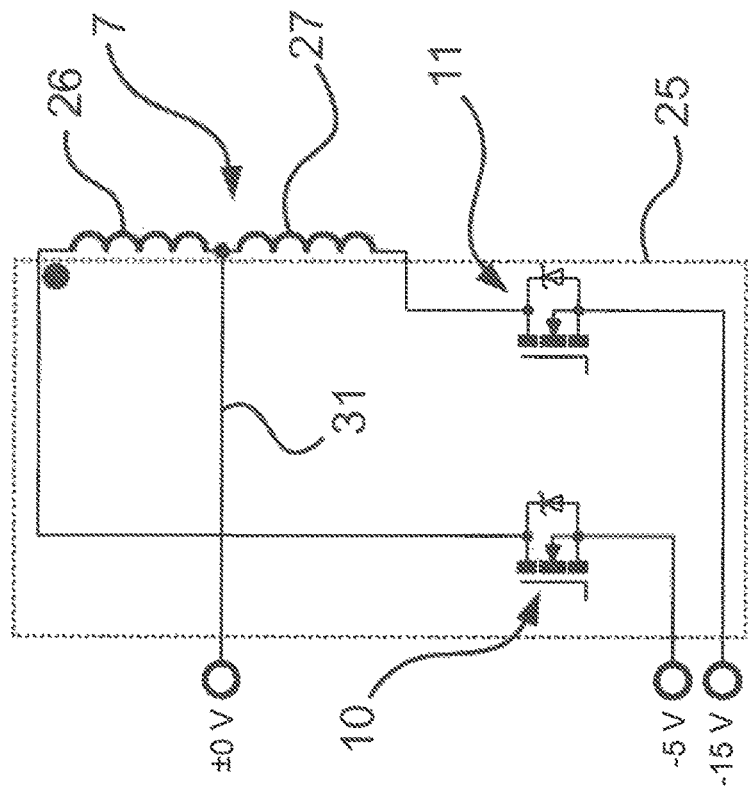
FIG. 4 is a schematic diagram of a first alternative primary-side voltage supply.

FIG. 4 shows a primary-side voltage supply of a doubly-fed push-pull circuit 25. In this case, the primary winding 7 is composed of symmetrical primary winding parts 26 and 27 on both sides of a tap 31 designed as a center tap. The two symmetrical primary winding parts 26 and 27 have the same number of turns. As in the full-bridge circuit 2 of FIG. 1, two different DC voltage sources are required here as well.

In the same way as in FIG. 1, however, two switching states are also possible: In a first switching state, the first semiconductor switch 10 is switched to continuity and the second semiconductor switch 11 is switched to close. In this switching state, a voltage of −5 V is present at the upper end of the symmetrical first primary winding part 26, while the lower end of the symmetrical first primary winding part 26 is at zero potential via the center tap 31. If the first primary winding part 26 has only one turn, the turn voltage UW1 in this switching state is again −5 V.

In a second switching state, the first semiconductor switch 10 is switched to closed and the second semiconductor switch 11 to open. In this second switching state, a voltage of −15 V is present at the lower end of the symmetrical second primary winding part 27, while the upper end of the symmetrical second primary winding part in turn is again at zero potential via the center tap 31. In a second primary winding part 27 with only one turn, the turn voltage UW2 is again +15 V in this switching state.

The asymmetrical bipolar AC voltage at the primary winding 26 and 27 is thus achieved here by a push-pull circuit that connects the primary winding 7 alternatingly to a DC voltage source and inverted to another DC voltage source. This asymmetrical bipolar AC voltage is directly induced into the secondary coils.

Figure 5:
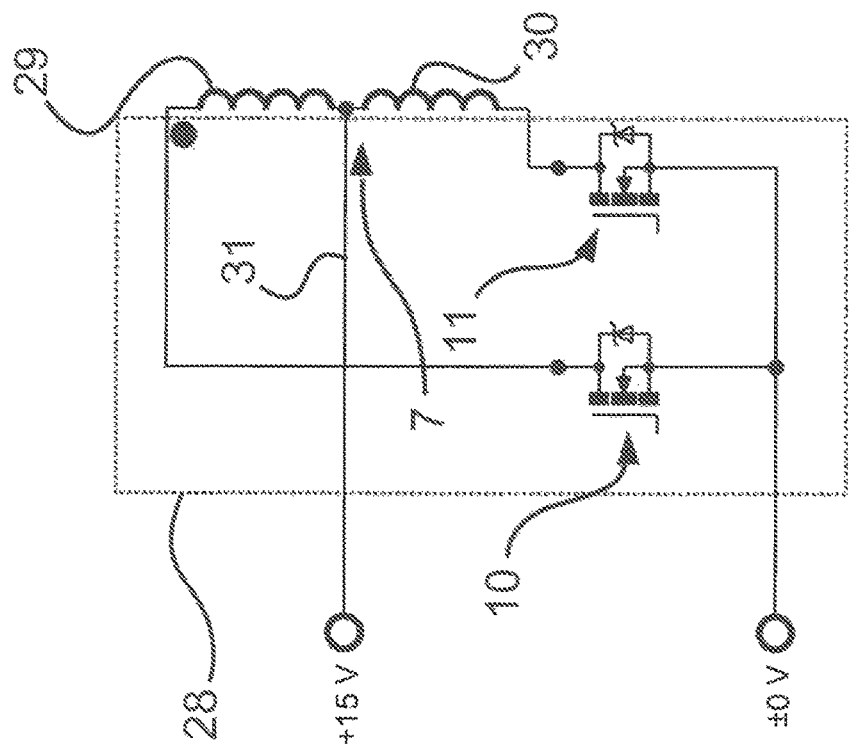
FIG. 5 is a schematic diagram of a second alternative primary-side voltage supply.

FIG. 5, on the other hand, shows a primary-side voltage supply with a singly-fed push-pull circuit 28. In this case, the primary winding 7 is constructed of asymmetrical primary winding parts 29 and 30 on both sides of a tap 31. The two primary winding parts 29 and 30 have a different number of turns. In the example shown, the asymmetrical first primary winding part 29 has three turns, while the asymmetrical second primary winding part 30 has only one turn.

In a first switching state, the first semiconductor switch 10 is switched to open and the second semiconductor switch 11 is switched to closed. In this switching state, a voltage of +15 V is present at the lower end of the asymmetrical first primary winding part 29 via the tap 31, while the upper end of the asymmetrical first primary winding part 29 is at zero potential. The three turns of the primary winding part 29 and the applied polarity of the voltage results in a negative turn voltage UW1 of −5 V. Since the secondary windings have only one turn, a voltage of −5 V is induced in the secondary windings in this switching state.

In a second switching state, the first semiconductor switch 10 is switched to closed and the second semiconductor switch 11 to open. In this second switching state, a voltage of +15 V is present at the upper end of the asymmetrical second primary winding part 30 via the tap 31, while the lower end of the asymmetrical second primary winding part is at zero potential. Since the second primary winding part 30 has only one turn, a positive turn voltage UW2 of +15 V is generated with the applied polarity in this switching state. Here, a bipolar asymmetric magnetization of the transformer is achieved via the asymmetrical primary winding. Since the secondary windings again have only one turn, a voltage of +15 V is induced in the secondary windings in this switching state.

The asymmetry of the AC voltage induced in the secondary windings is due to the transformation ratio between the respective primary winding part 29 or 30 and the secondary windings. Thus, the transformation ratio in the first switching state is 3:1, so that only a voltage of −5 V is induced in the secondary windings. In the second switching state, however, the ratio between the primary winding and the secondary winding is 1:1, so that the full +15 V from the primary winding are induced in the secondary windings.

Also in the exemplary embodiments shown in FIG. 4 and FIG. 5 with push-pull circuit and primary winding 26 and 27 or 29 and 30, each with tap 31, the duty cycle must be adapted to the respective half-wave voltage. The half-wave, which generates an amplitude of 5 V in the secondary windings, therefore extends over a period which is three times as long as the period of the half-wave, which generates an amplitude of 15 V in the secondary windings.

It should be noted also that, of course, it is also possible to use two independent primary windings, each of which is connected to its own voltage supply. In this case, the primary coils are alternately supplied with a voltage. While a rectangular pulse of +15 V is applied to the first primary winding during a period t1, no voltage is applied to the second primary winding. During a subsequent period t2, which again lasts three times as long as t1, however, the first primary winding is de-energized and a voltage of −5 volts is applied to the second primary winding.

There has thus been shown and described a novel asymmetrical bipolar voltage supply which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

LIST OF REFERENCE NUMBERS

1 Planar transformer
2 Primary-side full-bridge circuit
3 Secondary-side full-bridge circuit
4 Core
5 DC voltage source
6 Load
7 Primary winding
8 Secondary winding
9 Rectifier circuit
10 First primary semiconductor switch
11 Second primary semiconductor switch
12 Third primary semiconductor switch
13 Fourth primary semiconductor switch
14 First secondary semiconductor switch
15 Second secondary semiconductor switch
16 Third secondary semiconductor switch
17 Fourth secondary semiconductor switch
18 Rectifier diode for +15 V
19 Rectifier diode for −5 V
20 Driver
21 Multilayer PCB
22 EI core
23 E-portion
24 I-portion
25 Primary-side double-fed push-pull circuit
26 Symmetrical first primary winding part
27 Symmetrical second primary winding part
28 Primary-side singly-fed push-pull circuit
29 Asymmetrical first primary winding part
30 Asymmetrical second primary winding part
31 Tap
32 Voltage reference point

What is claimed is:

1. An asymmetrical bipolar voltage supply comprising a transformer, having at least one primary winding and a plurality of secondary windings and a primary-side power supply connected to at least one DC voltage source, wherein the circuit is configured so as to generate in the transformer two oppositely polarized winding voltages UW1 and UW2 with different amplitudes, and wherein each secondary winding supplies a voltage to a rectifier circuit.

2. Asymmetrical bipolar voltage supply as in claim 1, wherein the primary-side power supply comprises a push-pull circuit with two primary semiconductor switches, and wherein the at least one primary winding includes two primary winding parts and is connected to the push-pull circuit via a tap between the two primary winding parts.

3. Asymmetrical bipolar voltage supply as in claim 2, wherein the primary semiconductor switches of the push-pull circuit of the primary-side power supply are connected to two DC voltage sources with different voltages U1 and U2, and wherein both primary winding parts on both sides of the tap have the same number of turns.

4. Asymmetrical bipolar voltage supply as in claim 2, wherein the primary semiconductor switches of the push-pull circuit of the primary-side power supply are connected to the same DC voltage source, and wherein the two primary winding parts have a different number of turns on the two sides of the tap.

5. Asymmetrical bipolar voltage supply as in claim 1, wherein the primary-side voltage supply comprises a full-bridge circuit with four primary semiconductor switches, and wherein each leg of the full-bridge circuit is connected to a different DC voltage source.

6. Asymmetrical bipolar voltage supply as in claim 1, wherein the at least one DC voltage source connected to the primary-side power supply is a regulated voltage source.

7. Asymmetrical bipolar voltage supply as in claim 2, wherein the primary semiconductor switches are switched such that during a period t1 the winding voltage UW1 and during a period t2 the inverted winding voltage UW2 is present at the at least one primary winding, and wherein the integral under the winding voltage UW1 over the period t1 corresponds to the integral under the winding voltage UW2 over the period t2.

8. Asymmetrical bipolar voltage supply as in claim 1, wherein a plurality of secondary semiconductor switches is provided on the secondary side of the transformer, and wherein each secondary semiconductor switch is assigned exactly one secondary winding.

9. Asymmetrical bipolar voltage supply as in claim 8, wherein each secondary semiconductor switch is controlled by an associated driver.

10. Asymmetrical bipolar voltage supply as in claim 9, wherein the two voltage inputs of each driver are connected to an output of a rectifier circuit with diodes and capacitors associated with the driver.

11. Asymmetrical bipolar voltage supply as in claim 9, wherein each driver is controlled by a controller.

12. Asymmetrical bipolar voltage supply as claim 8, wherein the secondary semiconductor switches form a secondary full-bridge circuit that is supplied with a DC voltage via a further DC voltage source.

13. Asymmetrical bipolar voltage supply as in claim 1, wherein the transformer is configured as a planar transformer having an upper and a lower layer, each with a primary winding, between which the layers with the secondary windings are arranged.

* * * * *